United States Patent
Lai

(10) Patent No.: US 8,886,998 B2
(45) Date of Patent: Nov. 11, 2014

(54) SERVER AND POWER SUPPLY TEST METHOD

(75) Inventor: Wen-Bin Lai, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 349 days.

(21) Appl. No.: 13/425,433

(22) Filed: Mar. 21, 2012

(65) Prior Publication Data

US 2012/0304011 A1 Nov. 29, 2012

(30) Foreign Application Priority Data

May 23, 2011 (CN) .......................... 2011 1 0132606

(51) Int. Cl.
*G06F 11/00* (2006.01)
*G06F 11/22* (2006.01)
*G01R 31/40* (2014.01)

(52) U.S. Cl.
CPC ............ *G06F 11/2294* (2013.01); *G01R 31/40* (2013.01)
USPC ................................ 714/36; 714/32; 713/340

(58) Field of Classification Search
None
See application file for complete search history.

(56) References Cited

U.S. PATENT DOCUMENTS

| | | | |
|---|---|---|---|
| 5,481,730 A * | 1/1996 | Brown et al. ................. 713/340 |
| 6,651,190 B1 * | 11/2003 | Worley et al. .................. 714/43 |
| 7,613,938 B2 * | 11/2009 | Doyon et al. ................. 713/300 |
| 8,595,558 B2 * | 11/2013 | Xie et al. ......................... 714/36 |
| 2002/0054477 A1 * | 5/2002 | Coffey et al. ................. 361/686 |
| 2004/0267482 A1 * | 12/2004 | Robertson et al. ............. 702/118 |
| 2006/0153361 A1 * | 7/2006 | Chen ........................ 379/413.01 |
| 2009/0128186 A1 * | 5/2009 | Balasubramanian et al. .. 326/38 |
| 2011/0066871 A1 * | 3/2011 | Farmer et al. ................. 713/340 |
| 2011/0138233 A1 * | 6/2011 | Wang .............................. 714/46 |
| 2012/0131385 A1 * | 5/2012 | Chin et al. ....................... 714/32 |
| 2012/0226464 A1 * | 9/2012 | Lin ................................ 702/119 |
| 2012/0272101 A1 * | 10/2012 | Chi ................................. 714/39 |
| 2013/0132752 A1 * | 5/2013 | Chen ............................. 713/323 |
| 2014/0025966 A1 * | 1/2014 | Iwami et al. .................. 713/300 |

FOREIGN PATENT DOCUMENTS

| | | | | |
|---|---|---|---|---|
| CN | 101741577 A | * | 6/2010 | ............. H04L 12/12 |
| CN | 101840369 A | * | 9/2010 | ............. G06F 11/30 |
| CN | 102915265 A | * | 2/2013 | ............. G06F 11/26 |

* cited by examiner

*Primary Examiner* — Gabriel Chu
(74) *Attorney, Agent, or Firm* — Novak Druce Connolly Bove + Quigg LLP

(57) ABSTRACT

A control server is electronically connected with a number of test servers via a number network interfaces. The control server records a network interface number and an IP address of a baseboard management controller (BMC) of each test server, sets an IP address of a network card of the control server, and generates a test command. The test command comprises information in relation to a number of times for powering on a test server, a number of times for powering off the test server, and a time interval between a power-on operation and a power-off operation. The test command is sent to each test server by the control server according to the network interface number and the IP address of the test server. After receiving the test command, the BMC of the test server performs power-on/power-off operations of the test server according to the test command.

12 Claims, 3 Drawing Sheets

SERVER AND POWER SUPPLY TEST METHOD

BACKGROUND

1. Technical Field

Embodiments of the present disclosure relate to electronic device test technology, and more particularly, to a server and a power supply test method.

2. Description of Related Art

Power supply test is an important test item for testing stability of power supplies. Many power supply tests are performed using a test tool provided by a manufacturer of the servers, such as connecting the test tool to power supply units of the servers, and controlling power on/power off operations of the power supply units via operating control buttons of the test tool. However, the aforementioned test method needs the control buttons to be operated manually, and the test tool can just connect a few servers at one time because the test tool has limited hardware interfaces.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

In general, the word "module", as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable media include CDs, DVDs, BLU-RAY, flash memory, and hard disk drives.

Figure 1:
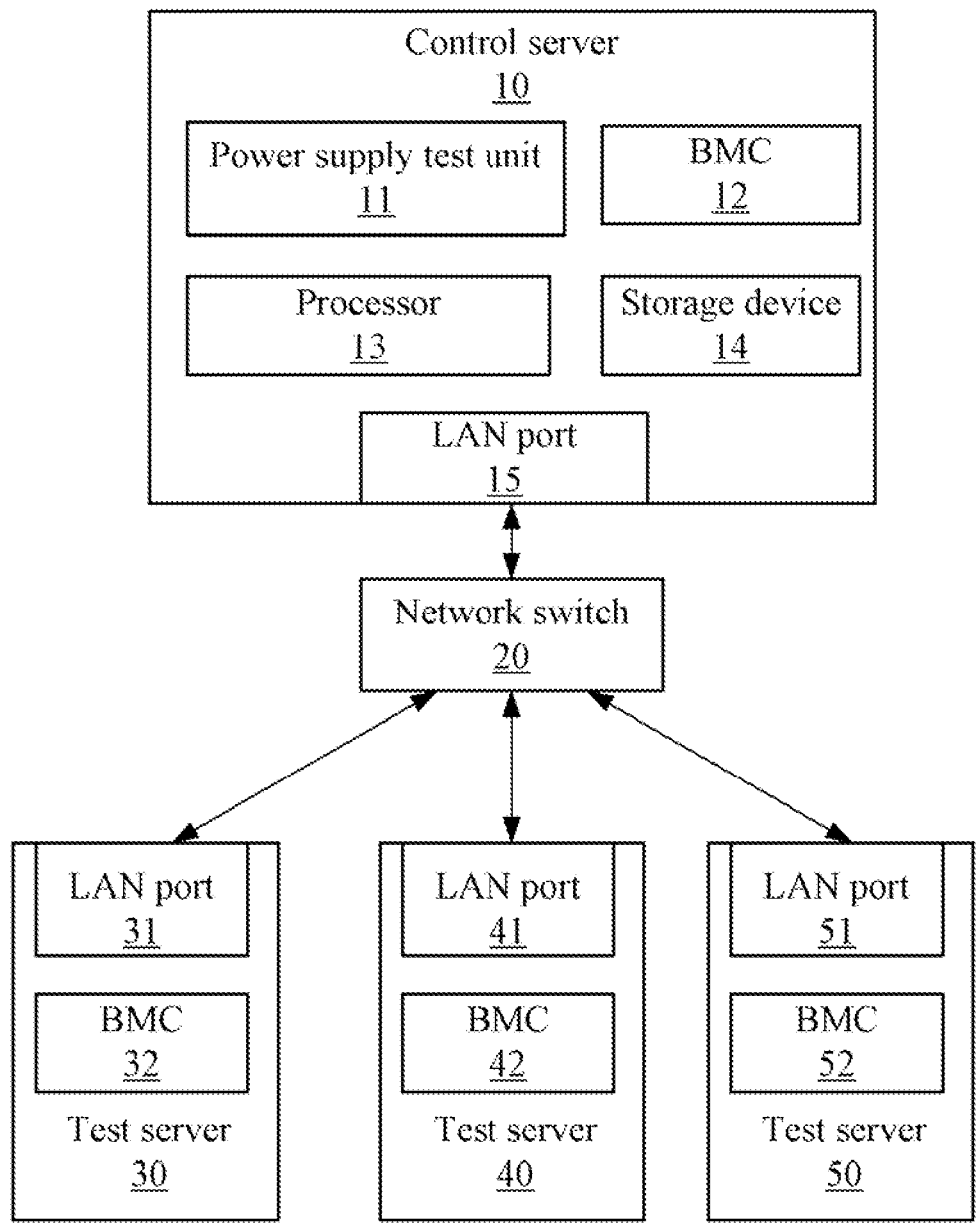
FIG. 1 is a block diagram of one embodiment of a control sever comprising a power supply test unit for testing power supplies of one or more test servers.

FIG. 1 is a block diagram of one embodiment of a control sever 10 comprising a power supply test unit 11 for testing power supplies of one or more test servers, such as test servers 30, 40, and 50 shown in FIG. 1. In one embodiment, the control server 10 and the test servers 30, 40, and 50 respectively include a baseboard management controller (BMC), such as the BMC 12 and 32, 42, and 52 shown in FIG. 1.

The control server 10 includes one or more network interfaces (e.g., RJ-45) for connecting the one or more test servers. In this embodiment, the control server 10 includes one network interface, such as the local area network (LAN) port 12. A network switch 20 is electronically connected to the LAN port 12, and ports of the network switch 20 are used to connect the one or more test servers to the control server 10. For example, as shown in FIG. 1, LAN ports 31, 41, and 51 of the test server 30, 40, and 50 are electronically connected to the LAN port 12 of the control server 10 via the network switch 20. In other embodiments, the control server 10 may include multiple network interfaces, and may electronically connect more than one test server without the help of the network switch 20.

The power supply test unit 11 generates a test command, and sends the test commands to each test server according to the network interface and an IP address of the BMC of the test server. The test command may include a number of times the test server powers on, a number of times the test server powers off, and a time interval between a power-on operation and a power-off operation. After receiving the test command, the BMC of the test server performs power-on and power-off operations of the test server according to the test command, and sends back test results to the control server 10 via the network interface of the test server. A detailed description is below.

Figure 2:
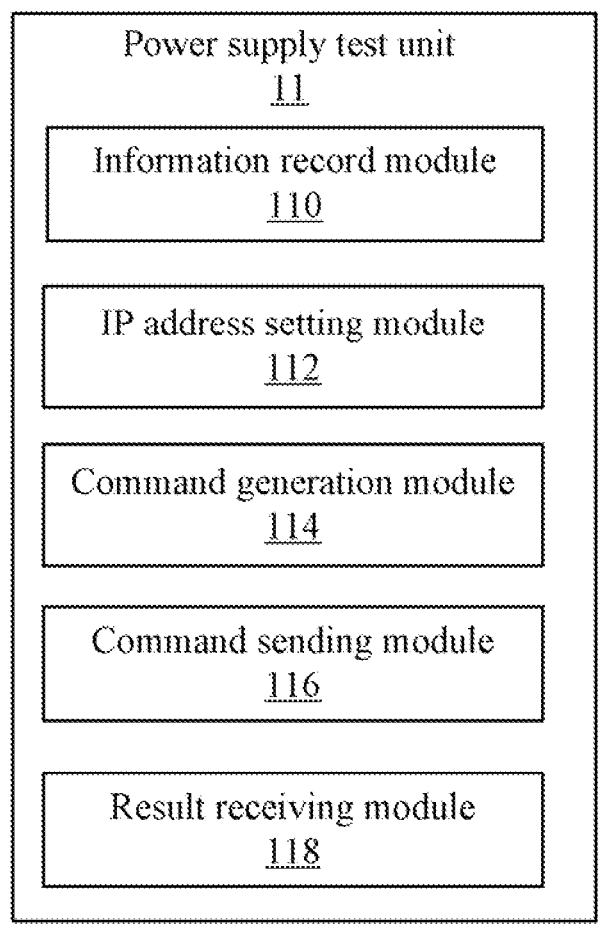
FIG. 2 is a block diagram of one embodiment of function modules of the power supply test unit in FIG. 1.

As shown in FIG. 2, the power supply test unit 11 includes an information record module 110, an IP address setting module 112, a command generation module 114, a command sending module 116, and a result receiving module 118. The modules 110-118 may comprise computerized code in the form of one or more programs (computer-readable program code) that are stored in a storage device 14 of the control server 10. The computerized code includes instructions that are executed by a processor 13 of the control server to provide the functions of the modules 110-118 illustrated in FIG. 3. The storage device 14 may be a cache, an independent, or a dedicated memory.

Figure 3:
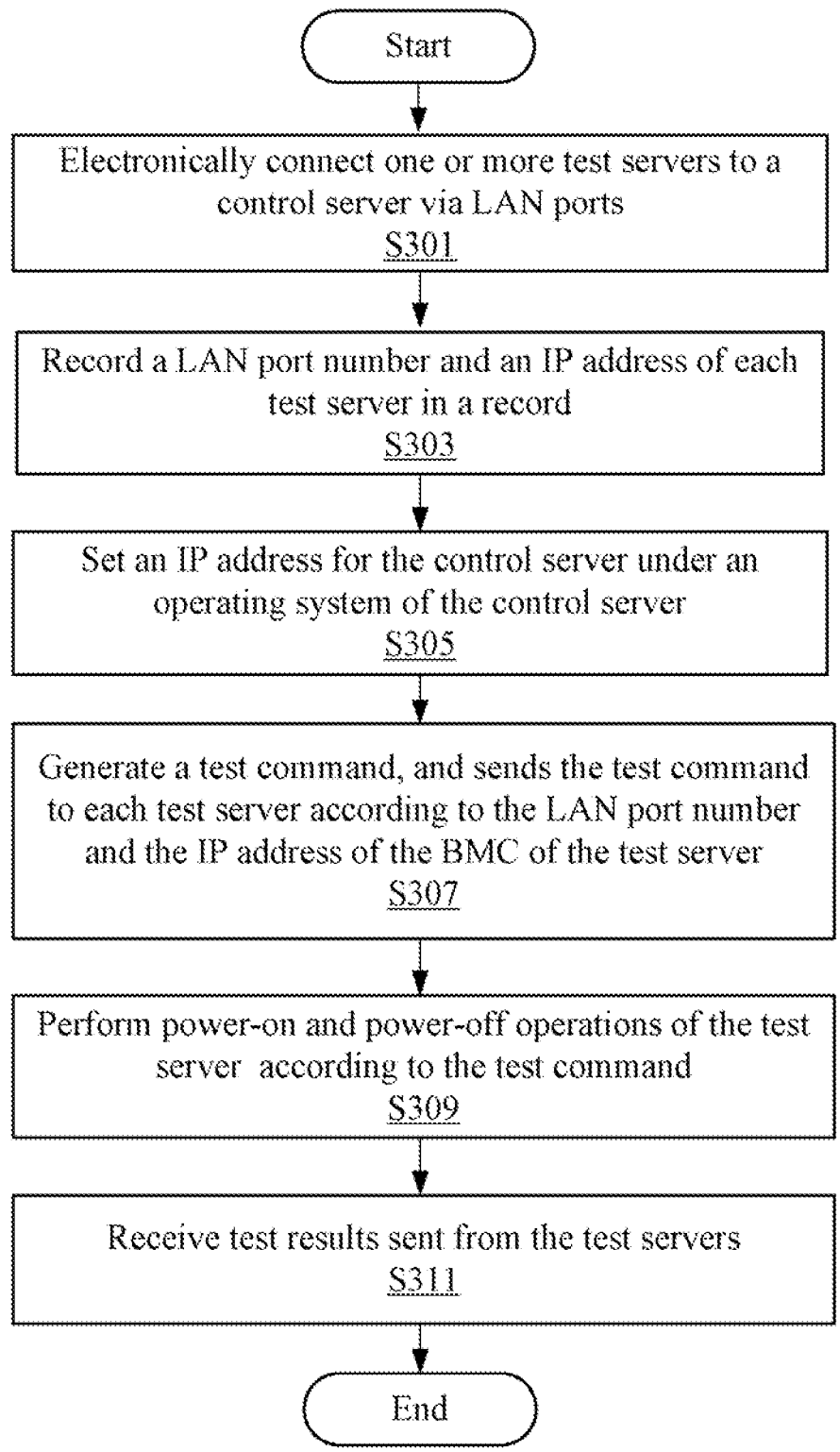
FIG. 3 is a flowchart of one embodiment of a power supply test method.

FIG. 3 is a flowchart of one embodiment of a power supply test method. Depending on the embodiment, additional steps may be added, others removed, and the ordering of the steps may be changed.

In step S301, the one or more test servers are electronically connected to the control server 10 via hardware interfaces of the control server 10 and the test server 10. For example, as shown in FIG. 1, LAN ports 31, 41, 51 of the test servers 30, 40, 50 are electronically connected to the LAN ports 15 of the control server 10 via the network switch 20. In one embodiment, the network switch 20 is a LAN switch.

In step S303, the information record module 110 records a LAN port number and an IP address of the BMC of each test server in a record, and stores the record into the storage device 14. The IP address and a subnet mask of the BMC of each test server may set under a basis input/output system of the test server or a disk operating system (DOS) at a power-on stage of the test server. For example, an IP address of the BMC 31 of the test server 30 may be "192.168.1.2", and a subnet mask of the BMC 31 may be "255.255.255.0", an IP address of the BMC 41 may be "192.168.1.3", and a subnet mask of the BMC 41 may be "255.255.255.0", an IP address of the BMC 51 may be "192.168.1.4", and a subnet mask of the BMC 51 may be "255.255.255.0". The IP address of the BMC of the test server should be set different from an IP address of a network card of the test server, to avoid IP address conflict.

In step S305, the IP address setting module 112 sets an IP address of a network card of the control server 10 under an operating system of the control server 10, where the IP address of the network card of the control server 10 falls within the same network segment of the IP addresses of the BMCs of the test servers. For example, the IP address of the network card of the control server 10 may be set as "192.168.1.1", and a subset mask of the network card of the control server 10 may be set as "255.255.255.0". If the IP address of the network card of the control server 10 falls out of the network segment of the IP addresses of the BMCs of the test servers, the control server 10 may cannot communicate with the test servers. The operating system of the control server 10 may be Linux or other type of operating system.

In step S307, the command generation module 114 generates a test command. In one embodiment, the test command may include information in relation to a number of times a test server powers on, a number of times the test server powers off, and a time interval between a power-on operation and a power-off operation. For example, the test command in relation to the test server 30 may include powering on the test server 30 20 times and powering off the test server 30 20 times, and a time interval between an power-on operation and a power-off operation may be 5 seconds. The command sending module 116 sends the test command to each test server according to the LAN port number and the IP address of the test server that is recorded in the record.

In step S309, the BMC of each test server performs power-on operations and power-off operations of the test server according to the test server, and sends back test results to the control server via the LAN port of the test server. The test results of each test server may include whether the test server has been successfully powered on/powered off every time, time used to power on/power off the test server, and errors that may caused a failure of an power-on/power-off operation.

In step S311, the test result receiving module 116 receives the test results send from the one or more test servers.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A control server, comprising:
   a storage device;
   a processor:
   one or more network interfaces electronically connected with one or more network interfaces of one or more test servers;
   one or more programs that are stored in the storage device and being executed by the processor, the one or more programs comprising:
   an information record module operable to record a network interface number and an IP address of a baseboard management controller (BMC) of each of the one or more test servers in a record, and store the record into the storage device;
   an IP address setting module operable to set an IP address of a network card of the control server, wherein the IP address of the network card of the control server falls within the same network segment of the IP addresses of the BMCs of the one or more test servers;
   a command generation module operable to generate a test command, wherein the test command comprises information in relation to a number of times for powering on a test server, a number of times for powering off the test server, and a time interval between a power-on operation and a power-off operation; and
   a command sending module operable to send the test command to each of the one or more test servers according to the network interface number and the IP address of each of the one or more test servers that is recorded in the record, so that the BMC of each of the one or more test servers performs power-on/power-off operations according to the test command.

2. The control server of claim 1, wherein the one or more programs further comprise a test result receiving module operable to receive test results sent from each of the one or more test servers.

3. The control server of claim 2, wherein the test results comprise whether each of the one or more test servers has been successfully powered on/powered off every time, a time used to power on/power off each of the one or more test servers, and errors that cause a failure of an power-on/power-off operation.

4. The control server of claim 1, wherein the IP address of the BMC of each of the one or more test servers is different from an IP address of a network card of each of the one or more test servers.

5. A power supply test method being performed by a processor of a control server, the control server being electronically connected with one or more test servers via one or more network interfaces, the method comprising:
   recording a network interface number and an IP address of a baseboard management controller (BMC) of each of the one or more test servers in a record, and storing the record into a storage device of the control server;
   setting an IP address of a network card of the control server, wherein the IP address of the network card of the control server falls within the same network segment of the IP addresses of the BMCs of the one or more test servers;
   generating a test command, wherein the test command comprises information in relation to a number of times for powering on a test server, a number of times for powering off the test server, and a time interval between a power-on operation and a power-off operation; and
   sending the test command to each of the one or more test servers according to the network interface number and the IP address of the test server that is recorded in the record, so that the BMC of each of the one or more test servers performs power-on/power-off operations according to the test command.

6. The method of claim 5, further comprising: receiving test results sent from each of the one or more test servers.

7. The method of claim 6, wherein the test results comprise whether each of the one or more test servers has been successfully powered on/powered off every time, a time used to power on/power off each of the one or more test servers, and errors that cause a failure of an power-on/power-off operation.

8. The method of claim 5, wherein the IP address of the BMC of each of the one or more test servers is different from an IP address of a network card of each of the one or more test servers.

9. A non-transitory storage medium storing a set of instructions, the set of instructions capable of being performed by a processor of a control server, the control server being electronically connected with one or more test servers via one or more network interfaces, the method comprising:
   recording a network interface number and an IP address of a baseboard management controller (BMC) of each of the one or more test servers in a record, and storing the record into the storage medium;
   setting an IP address of a network card of the control server, wherein the IP address of the network card of the control server falls within the same network segment of the IP addresses of the BMCs of the one or more test servers;
   generating a test command, wherein the test command comprises information in relation to a number of times for powering on a test server, a number of times for powering off the test server, and a time interval between a power-on operation and a power-off operation; and sending the test command to each of the one or more test servers according to the network interface number and the IP address of each of the one or more test servers that is recorded in the record, so that the BMC of each of the one or more test servers performs power-on/power-off operations according to the test command.

10. The medium of claim 9, wherein the method further comprises: receiving test results sent from each of the one or more test servers.

11. The medium of claim 10, wherein the test results comprise whether the one or more test servers has been successfully powered on/powered off every time, a time used to power on/power off each of the one or more test servers, and errors that cause a failure of an power-on/power-off operation.

12. The medium of claim 9, wherein the IP address of the BMC of each of the one or more test servers is different from an IP address of a network card of each of the one or more test servers.

* * * * *